United States Patent
Robinson

(10) Patent No.: US 10,063,204 B2
(45) Date of Patent: *Aug. 28, 2018

(54) LOUDNESS LEVEL CONTROL FOR AUDIO RECEPTION AND DECODING EQUIPMENT

(71) Applicant: EchoStar UK Holdings Limited, Keighley (GB)

(72) Inventor: David Robinson, Keighley (GB)

(73) Assignee: EchoStar UK Holdings Limited, Keighley (GB)

( * ) Notice: Subject to any disclaimer, the term of this patent is extended or adjusted under 35 U.S.C. 154(b) by 0 days.

This patent is subject to a terminal disclaimer.

(21) Appl. No.: 15/635,810

(22) Filed: Jun. 28, 2017

(65) Prior Publication Data

US 2017/0302240 A1    Oct. 19, 2017

Related U.S. Application Data

(63) Continuation of application No. 14/449,525, filed on Aug. 1, 2014, now Pat. No. 9,696,960.

(30) Foreign Application Priority Data

Aug. 1, 2013   (EP) .................................. 13178947

(51) Int. Cl.
*H03G 7/00* (2006.01)
*H03G 3/00* (2006.01)
(Continued)

(52) U.S. Cl.
CPC .......... *H03G 3/3005* (2013.01); *G06F 3/165* (2013.01); *H03G 3/20* (2013.01); *H03G 5/005* (2013.01);
(Continued)

(58) Field of Classification Search
CPC ........ G06F 3/165; H03G 3/20; H03G 3/3005; H03G 5/005; H03G 5/165; H03G 9/005;
(Continued)

(56) References Cited

U.S. PATENT DOCUMENTS 5,784,095 A * 7/1998 Robbins ................. H04H 20/79
                                                   348/E5.105
9,430,185 B2 * 8/2016 Robinson ................ G06F 3/165
(Continued)

FOREIGN PATENT DOCUMENTS

CA    2664461 A1    4/2008
DE    19818217      4/1998
(Continued)

OTHER PUBLICATIONS

EBU-TECH333444, "Practical Guidelines for Distribution Systems in Accordance with EBU R 1 to 8" Version 1.1.
(Continued)

*Primary Examiner* — Khai N Nguyen
(74) *Attorney, Agent, or Firm* — Lowe Graham Jones PLLC

(57) ABSTRACT

The application discusses a computer implemented method and apparatus for performing audio equalisation in an audio receiver device, such as an integrated receiver/decoder or set top box, or integrated TV, connected to one or more audio playback devices, such as a television unit, computer screen and speakers, amplifier or home theatre equipment. The method and apparatus use an equalisation process which compares audio signals received in different audio formats (e.g. MPEG-1 Layer II, AC-3 2.0, AC-3 5.1 and HE-AAC) with one another, allowing a correction gain factor to be determined for equalising the perceived loudness of the signals when played-back at a connected playback device.
(Continued)

The correction gain factor is then applied in the audio receiver device before output.

20 Claims, 7 Drawing Sheets

(51) Int. Cl.
*H03G 3/30* (2006.01)
*G06F 3/16* (2006.01)
*H03G 3/20* (2006.01)
*H04R 3/00* (2006.01)
*H03G 5/16* (2006.01)
*H03G 5/00* (2006.01)
*H03G 9/00* (2006.01)

(52) U.S. Cl.
CPC ............ *H03G 5/165* (2013.01); *H03G 9/005* (2013.01); *H04R 3/00* (2013.01); *H04R 2420/07* (2013.01); *H04R 2430/01* (2013.01)

(58) Field of Classification Search
CPC ... H04R 2420/07; H04R 2430/01; H04R 3/00
USPC .................................................... 381/77, 107
See application file for complete search history.

(56) References Cited

U.S. PATENT DOCUMENTS

| | | | |
|---|---|---|---|
| 9,696,960 B2 * | 7/2017 | Robinson | G06F 3/165 |
| 2004/0264714 A1 | 12/2004 | Fujita et al. | |
| 2006/0002572 A1 | 1/2006 | Smithers et al. | |
| 2007/0121966 A1 | 5/2007 | Plastina et al. | |
| 2008/0039964 A1 | 2/2008 | Charoenruengkit et al. | |
| 2008/0080722 A1 | 4/2008 | Carroll et al. | |
| 2009/0287496 A1 * | 11/2009 | Thyssen | H03G 7/007 704/500 |
| 2010/0083344 A1 | 4/2010 | Schildbach et al. | |
| 2011/0228953 A1 * | 9/2011 | Hess | H03G 3/32 381/107 |
| 2012/0051569 A1 * | 3/2012 | Blamey | H04R 25/70 381/314 |
| 2012/0328115 A1 | 12/2012 | Wolters et al. | |
| 2014/0140537 A1 * | 5/2014 | Soulodre | H03G 5/005 381/104 |
| 2014/0254828 A1 | 9/2014 | Ray et al. | |
| 2014/0369527 A1 | 12/2014 | Baldwin | |
| 2014/0371889 A1 | 12/2014 | Donaldson et al. | |
| 2015/0036838 A1 * | 2/2015 | Robinson | G06F 3/165 381/77 |
| 2015/0036842 A1 * | 2/2015 | Robinson | G06F 3/165 381/103 |
| 2015/0117685 A1 | 4/2015 | Reiss et al. | |
| 2017/0302240 A1 * | 10/2017 | Robinson | G06F 3/165 |

FOREIGN PATENT DOCUMENTS

| | | |
|---|---|---|
| EP | 2067254 | 6/2009 |
| GB | 2429346 A | 2/2007 |
| WO | 2008042785 A2 | 4/2008 |
| WO | 2013041875 A2 | 3/2013 |

OTHER PUBLICATIONS

ITU-R Radio Communication Sector of ITU Report ITU-R BS.2054-2 (May 2011) "Audio Levels and Loudness."
Machine Translation, Patent No. DE19818217, 4 pages.

* cited by examiner

| Codec | Expected Level | Gain |
|---|---|---|
| MPEG-1 Layer II | -23dB | -8dB |
| AC-3 2.0 | -31dB | 0 |
| HE-AAC | - | |
| AC-3 5.1 | - | |

Figure 5A

| Codec | Expected Level | Gain |
|---|---|---|
| MPEG-1 Layer II | -23dB | -8dB |
| AC-3 | -31dB | 0 |
| HE-AAC | -27dB | 0 |
| AC-3 5.1 | - | 0 |

Figure 5B

| Codec | Expected Level | Gain |
|---|---|---|
| MPEG-1 Layer II | -23dB | -8dB |
| AC-3 2.0 | -31dB | 0dB |
| HE-AAC | -27dB | 0dB |
| AC-3 51 | -23dB | 0dB |

Figure 5C

| Codec | Expected Level |
|---|---|
| AC-3 2.0 | -8dB |
| HE-AAC | -8dB |
| AC-3 5.1 | -8dB |

Figure 5D

| Gain to match | MPEG-1 Layer II | AC-3 2.0 | HE-AAC | AC-3 5.1 |
|---|---|---|---|---|
| MPEG-1 Layer II | x | - | - | - |
| AC-3 2.0 | -8dB | x | - | - |
| HE-AAC | -8dB | 0dB | x | - |
| AC-3 5.1 | -8dB | 0dB | 0dB | x |

Figure 5E

LOUDNESS LEVEL CONTROL FOR AUDIO RECEPTION AND DECODING EQUIPMENT

PRIORITY CLAIM

This patent application is a Continuation of U.S. Non-Provisional patent application Ser. No. 14/449,525, filed Aug. 1, 2014, entitled "LOUDNESS LEVEL CONTROL FOR AUDIO RECEPTION AND DECODING EQUIPMENT," and issued as U.S. Pat. No. 9,696,960 on Jul. 4, 2017, which claims the benefit of and priority to European Patent Application Serial No. 13178947.1, filed Aug. 1, 2013, and entitled "LOUDNESS LEVEL CONTROL FOR AUDIO RECEPTION AND DECODING EQUIPMENT," both of which are incorporated herein by reference in their entirety.

BACKGROUND

The invention relates to audio reception and decoding equipment, and in particular to digital television or radio apparatus for use in the home, in which the loudness levels of audio signals received in different audio formats is equalised for user playback.

Commercial and state owned broadcasting corporations have transmitted audio and video signals for entertainment and information purposes, since the early years of the twentieth century, using analogue encoding techniques, in which a property of the continuously varying electromagnetic wave was used to represent the audio or video information.

In recent years, signals have become transmitted for the most part entirely in a digital format, and there has been a proliferation of equipment available for audio (and video) reproduction in the home. Common devices now include not just television and radio receivers, but integrated receiver devices, such as television receivers, set top boxes, home theatre equipment, stereo equipment and speakers, games consoles, computers, DVD and blu-ray™ players. Furthermore, methods of transmitting signals to the home now include more than the traditional over the air or cable broadcasts and include satellite transmissions, copper and fibre optic cable television services, and the internet.

Digital transmission schemes encode the audio information into a digital format optimised for efficient and reliable transmission, rather than for absolute signal fidelity. At the broadcaster, the raw conversion of analogue signals to digital via an analogue to digital converter (ADC) will typically generate digital samples in Linear Pulse Code Modulation format (LPCM). LPCM encodes the analogue audio data as a string of samples, where each sample consists of a number of bits, zeros and ones in digital notation, representing the amplitude of the audio signal at the discrete time instant of that sample.

The LPCM samples are then encoded into one of many available data-reduced (and hence lossy) audio formats for digital broadcast. Lossy audio formats re-encode an approximation of the LPCM audio data in various ways that efficiently represent the time varying frequency and amplitude components of the audio signal. The lossy formats must subsequently be decoded to LPCM signals in a device within the consumer's home, the resulting LPCM samples fed to a digital to analogue converter (DAC), and the analogue signal from DAC fed to an amplifier and speaker in order to be audible to the consumer.

The advantage of this process to broadcasters is that the data-reduced format requires far less frequency spectrum for broadcast than the LPCM format, thus reducing costs and allowing a greater number of channels to be broadcast within a given amount of frequency spectrum.

However, the proliferation of different available audio formats for digital encoding, audio equipment for decoding a received signal, and even standards and protocols for connecting different pieces of equipment together, means that there are a large number of audio pathways an audio signal can take before it is decoded and heard by a user. Each pathway is essentially a combination of audio equipment, codecs and connections. Further, end users who purchase different decoding and playback equipment, may also use that equipment in different ways in accordance with their preferences. Significantly, according to the pathway taken by the audio signal, the processing of the audio signal will be different. Differences will arise from the operation of the encoding and decoding software, as well as the way in which individual pieces of audio equipment output the audio signal.

Depending on the equipment available to the end listener, and the way in which they have configured it for audio reproduction, it is possible therefore that audio signals received from different sources and encoded using different digital encoding formats will once decoded, be heard by the user at different perceived loudnesses. This is undesirable as it means that the listener must frequently search for the remote control and readjust the volume to a comfortable level when changing channels or audio inputs. The end listener is often not aware that the problem arises due to the complexity of the broadcast and programming chain and will believe that the loudness fault lies with the provider of the audio equipment, for example.

We have therefore appreciated that there is a need to address differences in loudness between different audio signals received by the user via different audio pathways.

SUMMARY OF THE INVENTION

The invention is defined in the independent claims to which reference should now be made. Advantageous features are set forth in the dependent claims.

In a first aspect of the invention, a computer implemented method for controlling an audio receiver device to equalise the loudness levels of audio signals output for playback on a connected audio playback device is provided. The method comprises: a) outputting at least a first and second audio signal to an audio output for playback on an audio playback device, the first and second signals being digitally encoded in different audio formats, the first audio signal being output at a first loudness level and the second audio signal being output at a second loudness level; b) controlling a connected display to invite input from a user indicating the relative loudness of the first audio signal compared to the second audio signal; c) based on the user input, adjusting one or more of the at least a first and second loudness levels until the user indicates that these are perceived to be heard at the same loudness level; d) saving the loudness levels in memory for future reproduction of the audio signals.

In a second aspect of the invention, a computer implemented method for controlling an audio receiver device to equalise the loudness levels of output audio signals for playback on a connected audio playback device is provided. The method comprises: a) outputting at least a first and second audio signal to an audio output for playback on an audio reproduction device, the first and second signals being encoded in different audio formats, the first audio signal being output at a first loudness level and the second audio signal being output at a second loudness level; b) detecting at the audio receiver device playback of the at least a first and second audio signals occurring at the audio reproduction device and recording with a microphone first and second recorded audio signals corresponding to the detected played back signals; c) analysing the first and second recorded audio signals and determining a value indicating the loudness of the first and/or the second recorded audio signals; d) based on the determined value, adjusting one or more of the at least a first and second loudness levels, until the value indicating the loudness of the first and/or the second recorded audio signals indicates that they are as loud as each other; and e) saving the loudness levels in memory for future reproduction of the audio signals.

In a third aspect of the invention, an audio receiver device, comprising control software stored on a processor for equalising the loudness levels of audio signals output for playback on a connected audio playback device is provided. The processor is operable to: a) output at least a first and second audio signal to an audio output for playback on an audio playback device, the first and second signals being digitally encoded in different audio formats, the first audio signal being output at a first loudness level and the second audio signal being output at a second loudness level; b) control a connected display to invite input from a user indicating the relative loudness of the first audio signal compared to the second audio signal; c) based on the user input, adjust one or more of the at least a first and second loudness levels until the user indicates that these are perceived to be heard at the same loudness level; d) save the loudness levels in memory for future reproduction of the audio signals.

In a fourth aspect of the invention, an audio receiver device, comprising control software stored on a processor for equalising the loudness levels of audio signals output for playback on a connected audio playback device is provide. The processor is operable to: a) output at least a first and second audio signal to an audio output for playback on an audio reproduction device, the first and second signals being encoded in different audio formats, the first audio signal being output at a first loudness level and the second audio signal being output at a second loudness level; b) detect at the audio receiver device playback of the at least a first and second audio signals occurring at the audio reproduction device and recording with a microphone first and second recorded audio signals corresponding to the detected played back signals; c) analyse the first and second recorded audio signals and determining a value indicating the loudness of the first and/or the second recorded audio signals; d) based on the determined value, adjust one or more of the at least a first and second loudness levels, until the value indicating the loudness of the first and/or the second recorded audio signals indicates that they are as loud as each other; e) save the loudness levels in memory for future reproduction of the audio signals.

A corresponding computer program and computer program stored on a tangible machine readable storage medium is also provided for implementing the claimed steps.

In one embodiment, step b includes controlling a display device coupled to the audio receiver device to present a graphical user interface, the graphical user interface seeking input from a user to control one or more of the first and second loudness levels.

In one embodiment, step b) includes seeking input from a user indicating which of the at least a first and second audio signals is loudest; and step c) includes: based on the user input indicating that the at least a first and second audio signals are perceived to be as loud as each other, saving the loudness levels in memory for future reproduction of the audio signals; and based on the user input indicating that one of the first and second audio signals is louder than the other, adjusting the output loudness level of one or more of the first and second audio signals and repeating steps a) to c).

Adjusting the output loudness levels may comprise changing the output loudness of one of either the first and second audio signal by a predetermined number of decibels.

The first and second audio signals may initially be output with a first correction factor intended to equalise one loudness with another.

The steps may be carried out by an audio receiver device, including one of an integrated receiver/decoder (set-top-box), or integrated TV.

In one embodiment, the loudness of the first audio signal is adjusted, and wherein the first audio output signal is decoded by the audio receiver device into a pulse code modulated digital signal, and wherein the second audio signal is output as an undecoded bit stream for decoding by downstream audio equipment.

In another embodiment, the loudness of the second audio signal is adjusted, and wherein adjusting the loudness includes adjusting loudness metadata in the signal.

The first and second audio signals may be encoded in different audio formats selected from MPEG-1 Layer II, MPEG-1 and 2 Layer III, HE-ACC version 1 or 2, AAC, LC-AAC, DTS, DTS-ES, Dolby Digital, Dolby Pulse, Dolby Digital Plus, NICAM, Opus, Ogg Vorbis, LPCM, and an analogue signal converted to LPCM.

BRIEF DESCRIPTION OF THE DRAWINGS

Example embodiments of the invention will now be described by way of example, and with reference to the drawings, in which:

FIGS. 5A-5E are schematic illustrations of the memory space allocation used in the STB.

DETAILED DESCRIPTION

Figure 1:
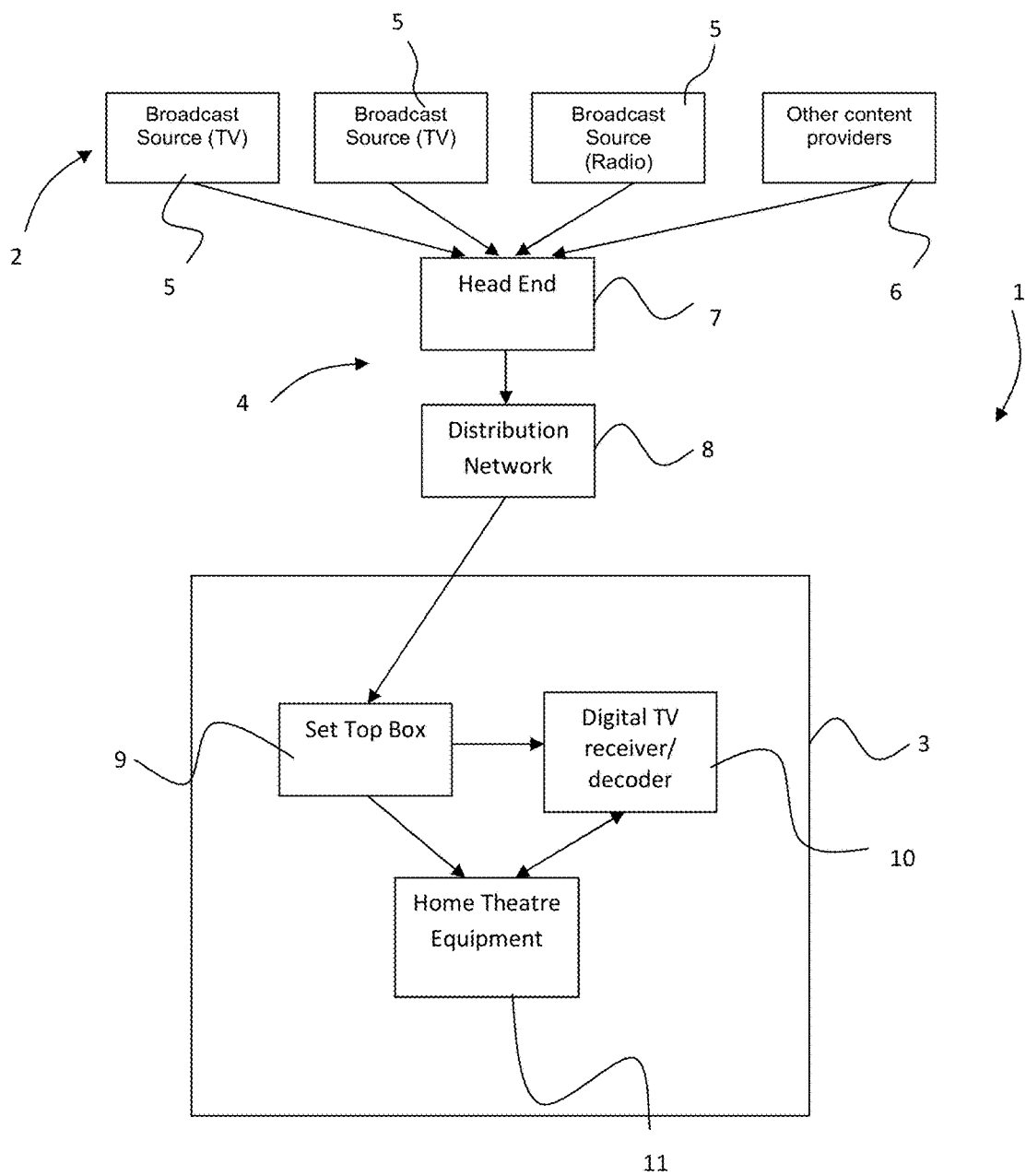
FIG. 1 is a schematic illustration of a distribution chain for digital programming.

Embodiments of the invention will now be described. These relate to methods, apparatus, systems and computer programs for determining the gain (positive or negative) to be applied to a signal output from an audio receiver device, such as an integrated receiver/decoder (IRD) or set top box (STB), or integrated TV, so that on playback via a connected audio playback device, the audio decoded from different transports streams will appear to the listener to be equal in loudness.

In particular, examples of a computer implemented method and apparatus for performing audio equalisation in an audio receiver device connected to one or more audio playback devices, such as a television unit, computer screen and speakers, amplifier or home theatre equipment will be described. In the examples given, the method and apparatus use an equalisation process which compares audio signals received in different audio formats (e.g. MPEG-1 Layer II, AC-3 2.0, AC-3 5.1 and HE-AAC) with one another, allowing a correction gain factor to be determined for equalising the perceived loudness of the signals when played-back at a connected playback device. The correction gain factor can then applied in the audio receiver device before output.

The difficulty of ensuring that decoded signals, decoded from different digital formats by different pieces of hardware, can be played back at an equalised loudness level can perhaps be better understood with reference to the differences between two particular formats, namely MPEG-1 Layer II signals and the formats provided by Dolby Digital™.

In digital audio systems, an MPEG-1 layer II signal is decoded to LPCM with a simple constant fixed relationship between the encoded audio data and the decoded audio amplitude. In other words, there is a one-to-one mapping between encoded audio data and the decoded audio waveform. The MPEG-1 layer II standard itself does not include any function to define a target amplitude level, a reference level, or a mechanism for making the encoded audio meet such a level. Despite being a lossy codec (here, the term codec is intended to mean appropriate software and/or hardware that can encode and/or decode an audio signal between appropriate digital formats) which results in a slightly altered signal, the output from the decoder is intended to be identical to the input to the encoder in terms of measured signal amplitude, and perceived loudness. Any slight changes in either of these respects are unintentional, and are merely a side-effect of the codec approximating the signal in order to represent in more efficiently (i.e. using fewer bits). When encoding at a bitrate which delivers good audio fidelity, while it may be possible to measure a slight difference in amplitude between the input to the encoder and the output of the decoder, it is almost always impossible to hear any difference in volume because the change is so slight as to be insignificant.

In contrast, the Dolby Digital™ AC-3 codec includes features which almost always cause the decoded audio amplitude to be radically different from the amplitude of the audio fed into the encoder. At the encoder, in addition to feeding in the LPCM audio signals to be encoded, metadata accompanying these signals is also made available to the encoder, and this metadata indicates the approximate perceived loudness of the audio. As designed by Dolby, it is the average loudness of the dialogue (or, in the absence of dialogue, the loudness of some part of the signal that is intended to be as loud as human speech) that is represented, relative to a full scale sine wave. This is communicated in the AC-3 bitstream in a metadata parameter called "dialnorm", short for dialogue normalisation. A value of −1 dB would indicate that the dialogue was exceptionally loud. A value of −31 dB would indicate that the dialogue was about as quiet as would ever be expected—lower values would mean the quietest parts of the audio signal may be lost in system noise, and so are not allowed. A common value might be −24 dB or −27 dB. There are automatic and manual methods for setting this value correctly.

In a Dolby Digital™ AC-3 decoder, the value of dialnorm is read, and the entire audio signal is adjusted during decoding such that the dialogue is reproduced at −31 dB (or, optionally, some other value). Therefore an audio signal received with a dialnorm value of −27 dB will be attenuated by 4 dB by the decoder. An audio signal received with a dialnorm value of −24 dB will be attenuated by 7 dB. An audio signal received with a dialnorm value of −31 dB will not be attenuated.

These audio levels expressed in decibels can be understood with reference to the decibel full scale system. The amplitude of digital audio signals is often measured using the term decibel Full Scale, written dBFS. "Full scale" in a digital audio system relates to a signal that uses the full numerical range available. For example, in an 8-bit digital audio system, the range of digital values consists of integers from 0 to 255 when expressed in decimal, and 00000000 to 11111111 when expressed in its native binary format. A full scale sine wave will have the peak of the negative half of the waveform cycle just reaching the value of 0 (in other words the digital sample taken at the peak will have a value of 00000000), and the peak of the positive half of the waveform cycle just reaching the value of 255 (the digital sample taken at the peak will have a value of 11111111).

The number of bits used to represent an LPCM digital signal is usually chosen based on the dynamic range required, the capabilities of the ADC and DAC, and the target environment. Most typically, 16, 20 or 24 bits are used. With a limited numerical range for quantisation, it would be impossible to represent a sine wave with a larger amplitude than digital full scale without distorting the shape of the waveform (for example, flattening or clipping the peaks of the usually smooth waveform), in which case the signal would cease to be a sine wave, and would sound audibly different.

However, any sine wave with a smaller amplitude can be expressed within this system (within the limits imposed by quantisation and dither), and the amplitude of such a sine wave can be expressed in terms of dBFS. For example, a sine wave with half the amplitude of the full scale sine wave would be said to have an amplitude of −6 dBFS, −6 dB being equivalent to one half. In the context of lossy audio formats which do not internally represent individual samples, the dBFS measure relates to the amplitude of the LPCM signal that can be decoded from the lossy audio format.

In the world of television broadcasting, many digital audio signals are usually set to be transmitted and recorded at a signal level of around −23 dBFS, so that there is a margin of 23 dB between the average level of the audio signal and the full scale value. This margin is known as the overhead, and the desirable signal level of around −23 dBFS is known as the reference level.

For simple signals, for example sine waves of the same frequency but different amplitudes, the loudness of the signal as perceived by a human listener is directly correlated to the amplitude of the signal over most of the audible range. For more complex signals, relating the signal amplitude to the perceived loudness is more challenging, and often involves some model of parts of human hearing for example the different sensitivity to different frequencies. In typical time-varying audio content, an average is used. Various automatic mechanisms exist to calculate approximately the perceived loudness of an audio signal, for example EBU R128 and Dolby LEQ. Throughout this description, where ever signals are described as being at a given target level, they should understood to have been recorded, produced, or adjusted such that the approximate average perceived loudness (usually as measured by one of these automated mechanisms, though manual human-based adjustment is also possible) matches the stated target level.

In many TV systems, some programmes and/or channels are broadcast with MPEG-1 layer II audio, while some programmes and/or channels are broadcast with Dolby Digital™ AC-3 audio. A user does not wish to hear such programmes and/or channels at different loudnesses, but we have appreciated that to deliver audio at the same loudness requires a number of conditions to be met:

1) The input to the MPEG-1 layer II encoder must receive an audio signal at a known audio level (for example at −23 dB). This is usually established by national broadcasting standards.

2) The audio signal and metadata input to the Dolby Digital™ encoder must match i.e. the dialnorm metadata must accurately reflect the audio level of the audio signal.

3) The Dolby Digital™ encoder must be set to decode to some known reference level (e.g. −31 dB).

4) The audio from the MPEG-1 layer II decoder must be adjusted so that it matches the reference level used by the Dolby Digital™ decoder (for example, by attenuating it by 8 dB).

Meeting the first two requirements is the responsibility of broadcasters, and the bodies setting national or international standards that the broadcasters follow in these matters. Meeting the last two requirements is the responsibility of the equipment manufacturers.

Where both processes are carried out within the same equipment, it is possible for the manufacturer to ensure that they match. The difficulty comes where the decoding of the MPEG-1 layer II audio happens in one piece of equipment (for example, an integrated receiver/decoder, such as an STB), while the decoding of the Dolby Digital™ stream happens in a different piece of equipment (for example, a Home Cinema Amplifier). This is common practice, since STBs do not usually incorporate the capability to fully decode and output the 5.1 channels of Dolby Digital™, so send the undecoded Dolby Digital™ signal to the Home Cinema Amplifier. Meanwhile, Home Cinema Amplifiers do not usually incorporate the capability to decode MPEG-1 layer II, while the STB does.

In this case, therefore, the STB does not know how much to attenuate the decoded MEPG-1 layer II audio, because it does not know the reference level used in the Home Cinema Amplifier's Dolby Digital™ decoder. Similarly, the Home Cinema Amplifier does not know how much to attenuate the PCM (decoded MPEG-1 layer II audio) it receives from the STB, because it does not know if the STB has already attenuated the signal.

Furthermore, as the home theatre or cinema amplifier is a generic device likely to be sold world-wide (unlike STBs which are typically designed for a specific national TV service), it does not know which national standards are in place. The Home Amplifier cannot therefore guarantee knowledge of the national broadcast standard mandated reference level for MPEG-II layer 1 decoding (item 1 above), and so cannot perform item 4 even if it expects that the STB has not attenuated the PCM signal at all.

A large number of audio codecs are used in consumer equipment, provided respectively by different standards bodies, equipment manufacturers and broadcasters. In the broadcasting domain, a common audio format is the MPEG-1 Layer II, mentioned above, developed and supported by the Motion Picture Experts Group. MPEG-1 Layer II is the standard for many digital audio broadcasts. It is also referred to as MPEG-2 Layer II (or MP2). MPEG-1 Audio Layer III refers to the well known MP3 format used for computer based manipulation and storage of sound files. HE-AAC is another audio format commonly encountered in broadcast and home entertainment systems. It is as an acronym for High Efficiency Advanced Audio Coding and is included in the MPEG-4 Standard. It is commonly used in digital radio standards, such as DRM (Digital Radio Mondiale) and DAB+ (Digital Audio Broadcasting). Other well known audio formats include those known developed and maintained by Dolby Laboratories™. Dolby™ provide audio encoding and decoding software known under various labels, including Dolby Digital™, DD, and AC-3. These include the well known Surround Sound systems which are often denoted by a suffix indicating the number of separate channels of audio data available. AC-3 2.0 for example refers to Dolby Digital™ Stereo sound, (the 2.0 referring to the left and right speaker channels), while AC-3 5.1 refers to Dolby Digital™ Surround Sound (the five available audio channels being front left and right, back left and right, and central). At the time of writing Dolby provide enhanced codecs including Dolby Digital™ Plus, or AC-3 7.1 (E-AC-3), which provides for better encoding and decoding and an additional number of channels. DTS and SDDS are examples released by other companies.

Broadcasters and equipment manufacturers have some freedom to choose the codecs that they employ. As a result, for the home environment, and depending on the configuration of the user equipment as well as the channels and broadcasts they receive, a single piece of user equipment will incorporate a number of different audio codecs.

A set top box in the home can often be connected to various different kinds of reproduction equipment such as a television, or the speakers or amplifiers of a home theatre system. There are a number of different types of connections, using different output technologies, such as HDMI, SPDIF or TOSLINK for example, again provided by different equipment manufacturers. Wireless connections may also be possible. Some audio or televisual reproduction equipment also has audio codecs integrated with the equipment itself. Most televisions equipped to receive digital broadcasts include a digital tuner and a digital decoder (including an audio codec) to process the incoming television signal and pass the audio to the television speakers, and the video to the television screen. A state of the art surround sound home theatre system is likely to have Dolby Digital™ audio codec to process an incoming digital bit stream in the speakers.

Where the STB is connected to a high end audio reproduction device, such as a television or home theatre speaker equipment, the audio reproduction device is likely to have inputs for receiving the unencoded audio signal bit stream and for decoding this internally. This means that it is desirable if the STB supports different output options so that it can accommodate the user's preference. The STBs may therefore either pass through the received digital signal undecoded as a digital bit stream for later decoding by the audio codec in the end audio reproduction device, or may decode the digital bit stream and provide an output in LPCM format. The STB can be configured in this context according to the preferences of the user.

In most cases, the playback or reproduction device (television or home theatre amplifier or some combination of the two), will have its own reference level when decoding the bitstream. For example, in the case of the Dolby Digital™ AC-3 formats, reference levels can vary by as much as 11 dB, target levels are −20 dB for Dolby RF Mode, −27 dB for DTS or THX recommendation, and −31 dB for Dolby Line Mode. As a result STB manufacturers cannot know how loud to make an MPEG-1 Layer II signal decoded to LPCM at the output. This could be played next to an AC-3 bitstream in an AV amplifier at an unknown level within the 11 db range mentioned above. A number of home theatre devices also automatically reduce the dB level of an input PCM signal by a few dB (for example, 4 dB) compared to the Dolby Digital™ decoder, meaning that the STB will be perceived more quietly on some devices in comparison to others. Furthermore, if the STB is required to transcode data from one format to another, for example from Surround Sound (AC-3 5.1) to normal 2 channel stereo (AC-3 2.0) or 5.1 HE-AAC, then even if the STB leaves the loudness levels intact throughout the transcoding process, the end user reproduction device may apply different reference levels to the different bit streams received at the inputs.

Depending on the configuration of the STB, the STB can therefore output audio signals at intrinsically different loudness levels, or at levels that while the same, will be handled differently by the end user reproduction equipment. Changing between different audio output channels or different input services on the STB can therefore result in perceptible jumps in the audio level of the signal being played back which are undesirable.

A system and method for addressing these problems will now be described with reference to FIGS. 1 to 6 of the drawings.

FIG. 1 is a schematic illustration of a signal distribution chain 1, including audio and video content sources 2, end consumer equipment 3 located in the home, and an intermediate transmission network 4. Sources of audio and visual signal content include broadcast sources 5 such as commercial and non-commercial television and/or radio channels. These may be international, national, regional or local channels. Broadcast sources are assumed to include digital signals encoded in any of the formats mentioned above, including, MPEG-1 Layer II, HE-AAC (version 1 or 2) and/or Dolby Digital™. Other formats may be possible, including MPEG-1 and 2 layer III, AAC, LC-AAC, (Low Complexity Audio Advanced Coding), DTS, DTS-ES, Dolby Digital™ Plus, Opus, and Ogg Vorbis. Other formats that are developed and/or adopted for audio broadcast or delivery are also considered. Audio and visual signal content sources also include other providers of content 6, such as pay per view video, managed internet television services, "over the top" (OTT) internet video services, audio from open web browsing, internet radio, podcasts, commercial providers, and subscription channels.

Data from the audio and video content sources 12 is passed to a head end service 7 for bundling with other available data for subsequent transmission to an end receiver over the distribution network 8. This may include one or more of cable, satellite and over the air links. The digital signals transmitted by the head end over the distribution network will include signals encoded in different data formats according to the source. In some regions, multiple head ends may work to common or agreed standards delivering one or more channels to end users via each head end, or the head end function may be split between multiple sites and/or multiple devices.

The transmitted digital signals are transmitted via the distribution system 4 and received at the end user equipment 3 for decoding. In this example, the signal is received initially at a set top box 9 for decoding or pass-through. The signal is then passed to reproduction devices, including digital television receiver 10 and to home theatre equipment 11. The digital television receiver 10 is assumed to an integrated receiver/decoder, meaning that it has the capability to decode audio and video bit streams. The digital television receiver 10 is also connected to home theatre equipment 11, including an amplifier and one or more speakers for audio output.

The set top box 9 may output the received signal via a number of different output mechanisms including HDMI (High Definition Multimedia Interface) and S/PDIF (Sony/ Philips Digital Interconnect Format) connections, RCA or SCART connectors, or to a headphone socket.

Broadcast sources 5 may transmit data in MPEG-1 Layer II, HE-AAC or Dolby Digital™, or any of the other formats discussed above.

According to the EBU (European Broadcasting Union) standards, MPEG-1 layer II is to be transmitted at a target Level of −23 LUFs (that is −23 dBFS using the loudness measure defined in EBU R128), while Dolby Digital™ may be decoded to a reference level of −20 dB, −23 dB, −27 dB, or −31 dB. Decoding the encoded audio data to an LPCM output may take place in any of the set top box 9, the digital television receiver 10, or the home theatre equipment 11, according to the capabilities of the device, and the preferences of the user. As indicated in FIG. 1, once an audio signal is received at the STB, then depending on the configuration of the consumer equipment, there are different options for where the digital bit stream is decoded.

1) The audio is decoded in the STB 9 to an LPCM signal and passed to the TV 10 or to home theatre equipment 11 for playback.

2) The undecoded audio is passed from the STB 9 to the TV 10 for decoding, and is subsequently output to the home theatre equipment 11 as a PCM signal for playback.

3) The undecoded audio is passed from the STB 9 to the home theatre equipment 11 for decoding, and is subsequently output to the television as a PCM signal for playback.

4) The undecoded audio is passed either from the STB or from the TV to the home theatre where it is decoded, and output as an analogue audio signal to the speakers associated with the home theatre system.

In all cases, the STB 9, the TV 10, and the home theatre equipment 11, may therefore output one or the other of a decoded bit stream, or the original undecoded bit stream.

As well as this choice of locations for decoding, the use of different connections, such as HDMI and SPDIF connections, can affect the desired target level for the PCM signal, and so can have an effect on the perceived loudness of the output audio experienced by the user. In addition, some home theatre equipment will automatically reduce a LPCM signal received at its input in comparison to its internal audio decoder levels.

Accordingly, the STB 9, in the example embodiments that follow is provided with software for equalising the perceived loudness of the different audio signal encodings and formats that it can output, whether the signal is output as a decoded LPCM signal, or as an undecoded digital bit stream. The software allows the STB to determine what reference level the sink device (end consumer equipment) is using, and adjust the LCPM loudness level or the audio format metadata to match. This is achieved by asking the user to perform a comparison test of different audio clips, each clip encoded in a particular format.

Figure 2:
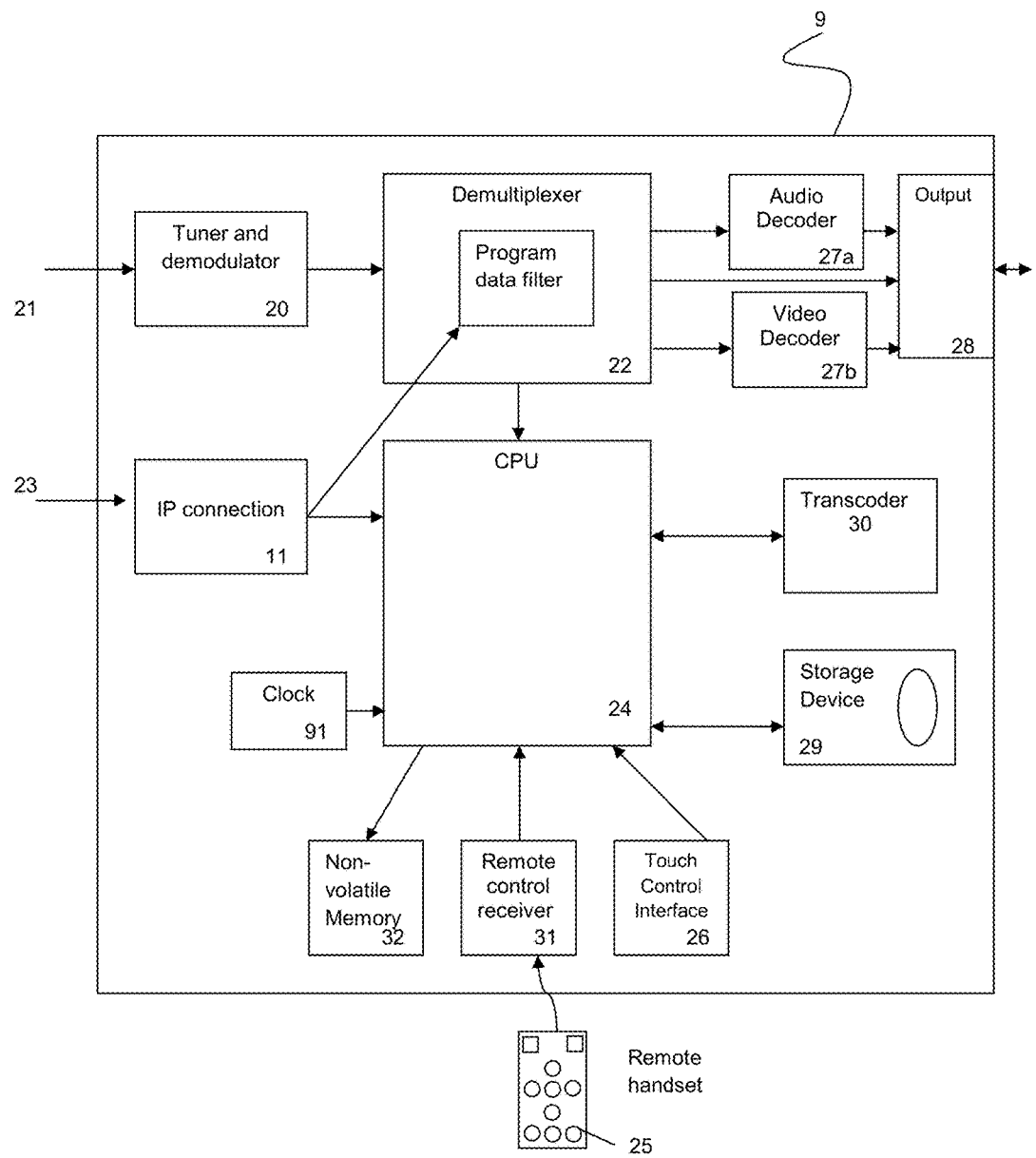
FIG. 2 is a schematic illustration of an STB.

FIG. 2 shows an embodiment of a set-top box 9 according to an example embodiment. The set-top box 9 may include a digital video recording (DVR) function. A receiving device such as a tuner/demodulator 20 is provided to receive broadcast streams, internet delivered streams or the like containing transmitted programmes. The tuner/demodulator is connected to an input 21 at which terrestrial, satellite or cable audio and video signals can be received for viewing, and to a demultiplexer 22. Input audio and video data can also be received via internet connection 23, which outputs a signal to demultiplexer 22 and to a CPU or processor 24.

A user interacts with the STB 9 via a remote control 25 or via a touch based control interface 26, such as channel selection buttons provided on the housing of the STB 9, to select a particular programme/channel to watch or record. The signals from the remote control are received by remote control receiver 31 in the STB 9. The remote control receiver 31 and front panel buttons 26 may be referred to as input interfaces.

The processor 24 receives instructions from the remote control receiver 31 and/or the touch based control interface and causes the demultiplexer block 22 to select the programme stream indicated by the user, either sending it to an audio decoder 27a and/or video decoder 27a, for decoding to an LPCM encoded signal for subsequent output at output 28, or passing through the undecoded bit stream to output 28 directly. Audio and video decoder 27a and 27b therefore necessarily includes at least codecs to convert a received bit stream in a digital format such as MPEG-1 Layer II, AC-3, and HE-AAC to a signal represented by PCM or LPCM. Output 28 may be connected to a reproduction device such as television 10 or home theatre equipment 11 via one or more connections, such as HDMI (High Definition Multimedia Interface) and SPDFI (Sony/Philips Digital Interconnect Format) connections, RCA or SCART connectors, or by modulated VHF or UHF output. Any interface, present or future which can carry an undecoded audio stream and/or a decoded PCM or LPCM audio stream, is contemplated within the invention.

Alternatively, the selected programme stream may be passed to a storage device 29 to be watched later, or to transcoder 30 for converting to a different audio encoding. Transcoding for example may be used when adapting the audio and/or video encoding from the one that is broadcast to one which can be decoded by some other target device, for example a tablet or smart phone. This may entail changing the codec, bitrate, resolution and/or video frame rate, audio sampling rate to match the capabilities of the target device. Alternatively, transcoding may be used when the input Surround Sound needs to be output to another device for decoding to 5.1 channels, but the input format (for example HE-AAC or Enhanced AC-3) cannot be decoded by the other device, and so must be transcoded into a format that the other device can decode (for example AC-3). Where the audio is being transcoded, the gain adjustments that are discussed elsewhere can be incorporated into the transcoding process by directly changing the gain of the audio signal during transcoding, or applied to the loudness metadata that may be copied or transcoded from the target format to the destination format.

The STB 9 also includes a non volatile memory 32 containing control and processor instructions for operation of the STB 9.

Figure 3:
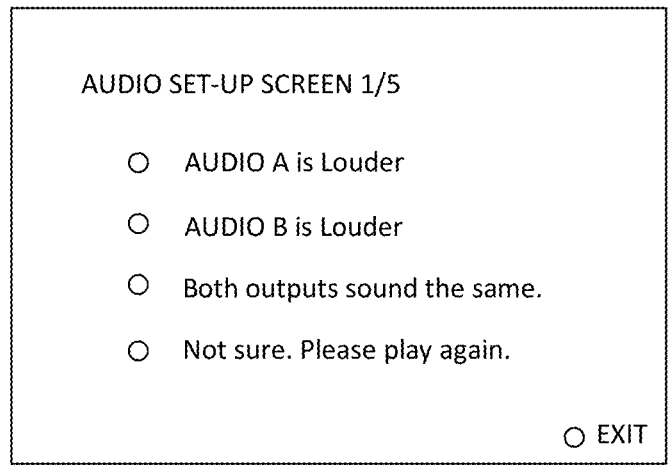
FIG. 3 illustrates an screen shots from an example graphical user interface.
Figure 4:
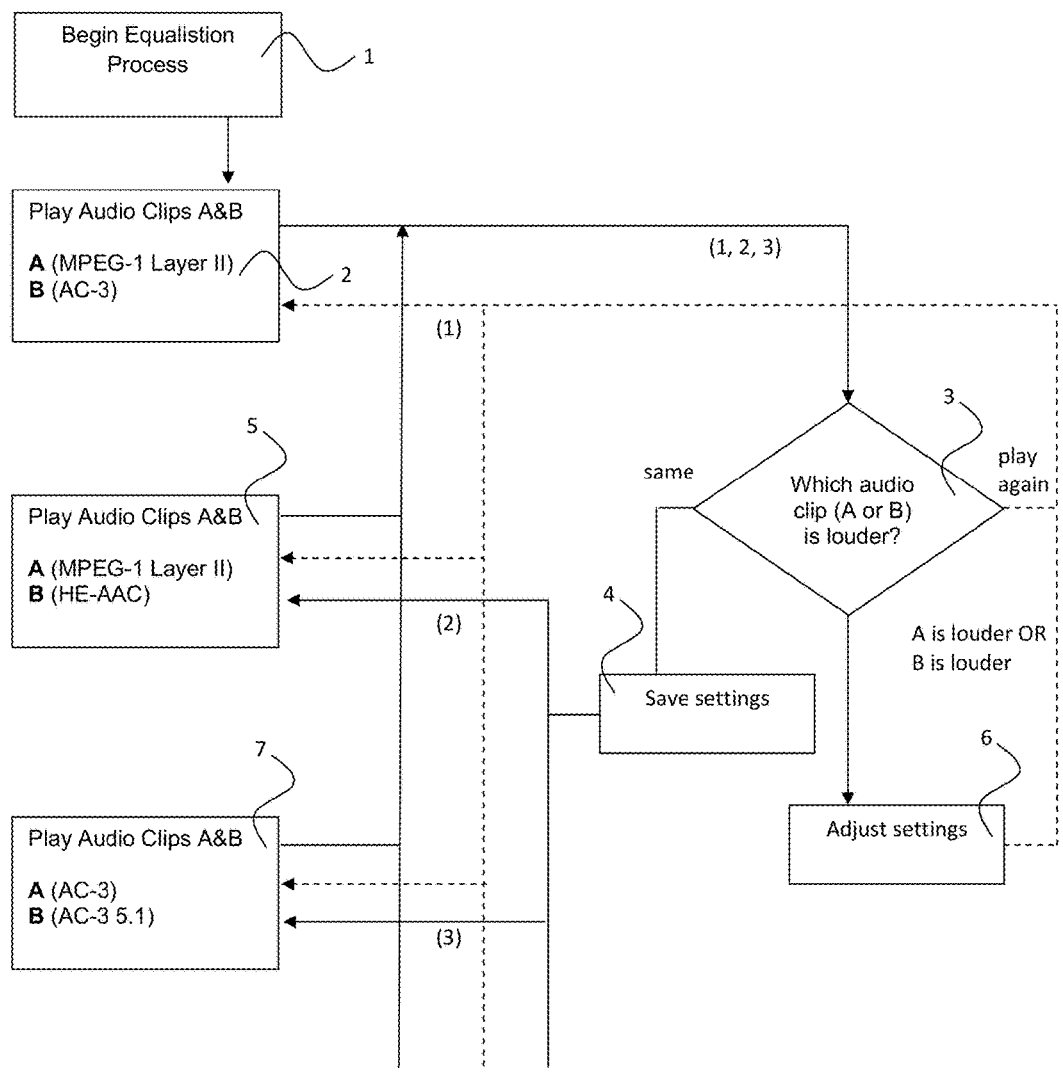
FIG. 4 is a flow chart illustrating an example equalisation process.

FIG. 3 shows an example graphical user interface generated by the processor 24 of the STB 9 and output to a display device for viewing via output 28. The purpose of the graphical user interface is to guide the user through an audio equalisation process for audio signals in different audio signal formats, whether decoded in the STB 9 or passed through without decoding to the output 28. This process may be referred to as a 'wizard' as is known in the art. FIG. 4 is a schematic illustration of the equalisation process itself, and FIG. 5 shows a region of memory in the STB 9 used to store the results of the equalisation process. This may be non volatile memory 32.

In the first step of the equalisation process (step 1 in FIG. 4) the equalisation process begins. This may happen automatically when the STB is started up for the first time, as part of an initialisation process. Where possible, the STB may wait to begin this process until it detects that its output ports have been connected to downstream equipment, or until the user indicates that the necessary connections have been made. The STB may include software to prompt the user to do this. Alternatively, the audio initialisation process may be begun at any time following selection of an appropriate option from a menu. This allows the user to recalibrate their audio visual entertainment system if they ever change their TV or amplifier configuration.

The wizard operates by guiding the user through a process in which the user is played at least two audio clips, typically one decoded from the bitstream and output as LPCM, and one the undecoded pass-through signal to be decoded by the user equipment. In some cases, the two clips may both be undecoded pass-through signals to be decoded by the user equipment. The graphical user interface requires the STB to be properly connected to the end user equipment such as the television or home theatre speakers. Thus, the two audio clips will ultimately be heard by the user via the speakers of the television or the speakers of the home theatre system. Both the decoded and the pass through audio signal will be transmitted to the speakers via the same connections.

The audio clips that are played will consist of a suitable level matching signal, such as one or more of pink or white noise, narrow band noise, other types of noise, and speech. Common reference levels are known to be −20 dB, −23 dB, −27 dB, and −31 dB, and it is helpful to make the audio clips available at these levels. This may be by storing separate clips with the appropriate input loudness and/or reference data, or alternately by storing a single clip and outputting it from the STB with the necessary gain or attenuation. Similarly, for codecs that are decoded to LPCM before output (such as MPEG-1 Layer II in this example), while the description states that the MPEG-1 Layer II is decoded to LPCM as part of the matching process, it will be appreciated that it is equally acceptable to use pre-decoded or equivalent but directly created LPCM audio clips during the process, as these will be treated in the same way by the end user equipment performing the playback.

As indicated in step 2 of FIG. 4, the first two audio formats to be loudness equalised comprise an MPEG-1 Layer II signal decoded to LPCM and an AC-3 signal. In step 3, these signals are played to the user in sequence and a first screen of the graphical user interface is output on a display (equalisation of these two audio formats alone is expected to address the audio mismatch problems of most consumers, meaning that the later steps may be optional. They are included here however for completeness).

FIG. 3 shows a first screen of the graphical user interface, corresponding to the user being played two identical audio clips, "AUDIO A" decoded from MPEG-1 Layer II and output as LPCM, and "AUDIO B" received as a bitstream in the AC-3 format and passed through the STB without decoding to the output. The graphical user interface asks the user to indicate which signal is perceived as being louder, and presents the user with options for reply. The user can select a first radio button to indicate that Audio clip A is louder, a second button to indicate that Audio Clip B, is louder, a third button to indicate that they both appear to be as loud as each other, and a fourth button to indicate that they are not sure, and would like to hear the clips again. The fourth button is optional. Selection can be via the STB remote control or handset, via user input buttons on the STB chassis, or indeed any other supported input method.

The STB begins the process by outputting the two audio clips at audio levels that are likely to be correct. For example, the MPEG-1 Layer II stereo stream would be output with 8 dB of attenuation (assuming an initial expected audio level of −23 dB), to match the AC-3 stream typically decoded to a reference level of −31 dB. If the user indicates that the two audio clips appear to be playing at the same loudness, then the initial loudness values chosen by the STB were correct and would be saved in memory for that combination of outputs (step 4 of FIG. 4). This is illustrated in FIG. 5A for the two audio formats that are the subject of the comparison. If required, the wizard then moves onto the next comparison of audio clips, say MPEG-1 Layer II and HE-AAC and repeats the equalisation process for two different services or audio formats in step 5.

In practice, the only audio formats that will require comparison will be those that are broadcast. As this information will be known to STB manufacturers in advance, the wizard can be configured accordingly to compare the required audio formats. If the audio formats that are in use changes, it is also possible to update the software in the STB to account for this. Updating the STB software controlling the wizard can be carried out remotely. Alternatively, the STB can be configured to scan the available broadcast transmissions that are available during the automatic tuning process, and record which audio formats are in use. This information can then be used to control the audio formats which feature in the comparison wizard.

Assuming that one of the signals is noticeably louder than the other signal, then the user would indicate this using the selection options of the graphical user interface. The controller of the STB, would then play the two clips again, but with the louder signal attenuated, say by −6 dB for example. This is illustrated in Step 6 of FIG. 4 in which the audio settings for the signal are adjusted, and the original signals are then replayed (by returning to step 2, 5 or 7 respectively. Most listeners are able to detect a difference of 6 dB. It is preferable to attenuate the signals if possible, as making one of the signals louder could cause clipping (that is where the loudness of the signal is too great to be reproduced by the down stream audio equipment and there is a degradation in the perceived quality of the signal). However, it is possible to apply gain to the signals, and the application of gain may be necessary to ensure that equalisation process takes place.

The process then repeats and the user is shown the screen of FIG. 3 again and asked to indicate which signal is louder. Once the user indicates the two signals sound the same, the settings are stored in memory, and the process moves onto the next two signals that are to be compared.

In alternative examples of the invention, the step size may be set to a value that is different to the value of 6 dB mentioned above, either automatically or via suitable controls provided by the wizard. A smaller step size may be desirable if a step size of 6 dB results in an audio loudness that overshoots the optimal position, for example causing an audio signal A that was perceived as louder than the comparison audio signal B, being perceived in the following step as quieter than the comparison audio signal B. Step sizes of 2 dB or 1 dB are therefore also possible within the comparison process, but should in general only be used after the user has repeatedly reported that the signal under review is first perceived as louder, then quieter, and so on. This detection may be carried out automatically as noted above.

As indicated in steps 2, 5 and 7 of FIG. 4, the equalisation process is set up to perform a comparison between at least three pairs of signals; 1) MPEG-1 Layer II and AC-3 2.0) MPEG-1 Layer II and HE-AAC; and 3) AC-3 2.0 (stereo) and AC 3 5.1 (surround sound). Of course, the comparison could be performed on other pairs of services not just those listed here, and the cyclical process of FIG. 4 is accordingly illustrated as continuing beyond the three comparisons explicitly described. Once the final comparison has been made, then the wizard exits and normal control of the STB returns to the user.

In more advanced embodiments, the same audio formats may be presented for equalisation but processed with and without audio description, and optionally with and without particular downmix coefficients, since the misapplication of channel downmix coefficients in a downstream device will cause the loudness to change. This variety of signals means that potential downstream faults (such as loudness mismatches due to the manner in which the downstream equipment treats different formats or streams with different characteristics in a different manner) can be caught more easily. To cater for this, pre-encoded, or on the fly audio clips (from live bit streams), may be captured in the STB and used in the comparison. These comparison measures may be available in a professional or 'expert' set up process separately accessed via the wizard. It is preferable to use pre-encoded clips with known levels, but it is also contemplated that there might be some circumstances where the user would prefer to use real broadcast material as this might reveal some new problems that the pre-encoded clips have not been designed to address.

In addition, where broadcasts do not follow a single particular loudness standard (especially when broadcasting in formats such as MPEG-1 layer II which do not include loudness metadata), there are two possibilities for determining the desired gain based on the input signal. First, it is possible to use existing processes (e.g. Dolby Volume, SRS TruVolume etc) to change the average loudness of an MPEG-1 layer II stream such that it matches a known chosen level (such as that used by another broadcaster or codec) and subsequently use the process described above to find the additional gain that it may then be necessary to apply. Alternatively, over a period of time, it is possible to identify a section of speech in one of the live broadcasts using MPEG-1 Layer II audio coding using a speech detection algorithm to segment the parts that consist of speech from the rest of the signal, and use a simple loudness meter to check the loudness of each segment before choosing one that lies towards the middle of the encountered range (that is a normal talking level, not shouting or whispering). This section of speech can then be used as the example signal in the comparison process described above. Hence the gain adjustments will be calculated relative to the actual broadcast audio levels, rather than to a level which is assumed to be correct. Speech is a useful bench mark for comparing the loudness of different audio signals with one another, as speech data can be readily identified and extracted from an audio signal.

At each stage of the comparison 1, 2, and 3 the memory is updated in step 4, with the adjustment gain values to be applied to the signals. As each cycle of the comparison is performed a further entry is saved into the memory space. The progression of data is illustrated in FIG. 5 by way of example.

FIGS. 5A to 5C are schematic illustrations of the memory space allocation used in the STB according to one example. Each of the available codecs is listed the left hand column, in the middle column is the anticipated reference or target level at output, and in the right hand column is the desired gain or attenuation determined by the equalisation process. It will be appreciated that the gain or attenuation is relative to the output levels usually applied by the STB. In FIG. 5A, therefore, the MPEG-1 Layer II signal is expected to be received at −23 dB, and requires an −8 dB attenuation to match the loudness of the Dolby Digital™ signal decoded to −31 dB. In this example, the expected MPEG level can be anticipated from the country in which the STB is likely to be deployed and information about the levels used in that country. If for any reason the MPEG-1 Layer II signal or AC-3 format audio signal are output at different loudnesses on the end user equipment, then the actual gain desired may be different, but this will be determined by the equalisation process.

Also, for international or foreign channels, the most likely initial adjustment may be applied to the signal, different to corrections according to the local standards and according to knowledge of the specific national standard under which the international channel originated.

The equalisation process of FIG. 4 continues until the necessary gains are recorded for each comparison.

FIGS. 5D and 5E are schematic illustrations of memory organisations used in the STB according to alternative examples. In these examples, the expected level of the audio format is not used, and the information recorded in memory is simply the amount of gain needed to bring the loudness of one audio format into line with another. So in FIG. 5D, the STB uses each of the non MPEG-1 Layer II formats as a base line and records the gain necessary to make the MPEG-1 Layer II audio stream match the loudness of decoded data for each respective audio format. In the example, shown here, the right hand column means that MPEG-1 Layer II needs to be attenuated by 8 dB in each case, from which it can be assumed that the loudness reproduction of data in each of the respective audio formats shown in the left hand column is identical. Of course, if the amount of adjustment required to equalise the loudness of MPEG-1 Layer II data were found to be different for respective ones of the audio formats in the left hand column, when viewed in comparison to each other, then this would indicate that those formats were being played back at different loudnesses. Using the MPEG-1 Layer II signal as a baseline for comparison, the STB can then determine the difference between any two formats shown in the table by simple subtraction.

Alternatively, as shown in FIG. 5E it is possible to compare each audio format to each of the other audio formats until all pairwise combinations have been exhausted. For each combination, the attenuation or gain needed to equalise the loudness of data decoded from the audio format expressed in the left hand column is recorded in the row column entry for the audio format in the first row. This will lead to positive and negative values for like pairwise combinations (e.g. +8 dB or −8 dB). In this case, the negative value is usually chosen and the louder data made less loud to avoid clipping.

Once the equalisation process is finished, using any of the processes illustrated above, the STB will know what gain or attenuation should be applied to the audio signals it outputs, taking into account the particular user equipment to which it is connected. For each available audio codec, a correction value, in terms of a positive or negative gain value is stored. This correction value can then be applied to all audio signals decoded with that codec.

For signals that are decoded to LPCM, the loudness of the output signal is simply scaled by the dB level indicated in the equalisation process. In other words, if the STB is configured to output PCM signals or LPCM signal at a level of −8 dB below reference, but the test reveals that this signals sounds louder than the AC-3 signal decoded downstream at the home theatre equipment, then it may apply a further attenuation of −6 db (−14 dB) to the signal on output.

Where formats are output as a bitstream for example AC-3 2.0 and AC 3 5.1, then the STB will adjust the metadata that the downstream user equipment responds to in order to effect the change. For example, if the equalisation software indicates that the AC 3.5.1 should be played at a higher level than the AC-3 2.0 bitstream, the STB can adjust the dialnorm metadata used by Dolby Digital™ to indicate the desired output loudness. These level adjustments can therefore be applied to all audio signals that it outputs, broadcast, IP, etc.

While this adjustment is even simpler than changing the gain of the audio format that are decoded within the STB, it does have disadvantages. Various other potential downstream processes (for example, dynamic range compression and clipping prevention) rely on the original value of dialnorm, and may not operate as intended if that value is changed.

Therefore it may be beneficial, once the wizard has completed, to post-process the set of values stored in the memory structure illustrated in FIG. 5. The intent would be to minimise the gain changes applied to the audio formats output as bitstreams, where changing the metadata is relied upon to implement that gain change. For example, it is preferable to adjust the gain applied to MPEG-1 Layer II streams before adjusting the gain applied to audio formats output as bit streams. Thus, if loudness equalisation can be carried out solely by the gain applied to MPEG-1 Layer II data, it is preferable if the audio format gain is not adjusted. Where, the gain is necessarily applied to the audio format data, then it is preferable if this can be minimised by changing the MPEG-1 Layer II data partly to compensate.

The intent would also be to avoid increasing the gain of any format above 1 (in these examples making the audio level in decibels level larger, that is less negative) unless there was some reason to believe that doing so would not introduce clipping. Preference would be given to the most used audio formats (known from a channel scan, or a pre-defined preference). If simple logical checks failed to reveal the best compromise, a weighted average or least means squares procedure could be used to determine the best (or most tolerable) gain values. The range of possibilities is limited, since the relative gains must be maintained to enable the loudness equalisation to work, and steps smaller than 0.5 dB are essentially inaudible, and need not be considered.

Any apparent discrepancies in the results obtained from the user may be checked by a re-test, potentially using different pairs of codecs in the new test. For example, if all comparisons are carried out against MPEG-1 layer II (codec A) but codecs B and C which are not known to have different reference levels in any commercially available equipment were found to require a different gain correction to match MPEG-1 layer II, then the user may be asked to directly compare B with C. If the results match those of the separate comparisons with MPEG-1 layer II, then they should be used. If the results indicate that B and C have the same loudness, then the previous erroneous comparison with MPEG-1 layer II may be repeated or (if it is clear which is in error) discarded. Conversely, if one of the original tests involved B against C and revealed a large unexpected difference, it would be wise to test MPEG-1 layer II against B, and then MPEG-1 layer II against C.

Other offsets and adjustments could be made to accommodate other formats with no specific reference levels. For example, home recorded CDs to MP3 format, legacy analogue inputs, networked media and so on.

Figure 6:
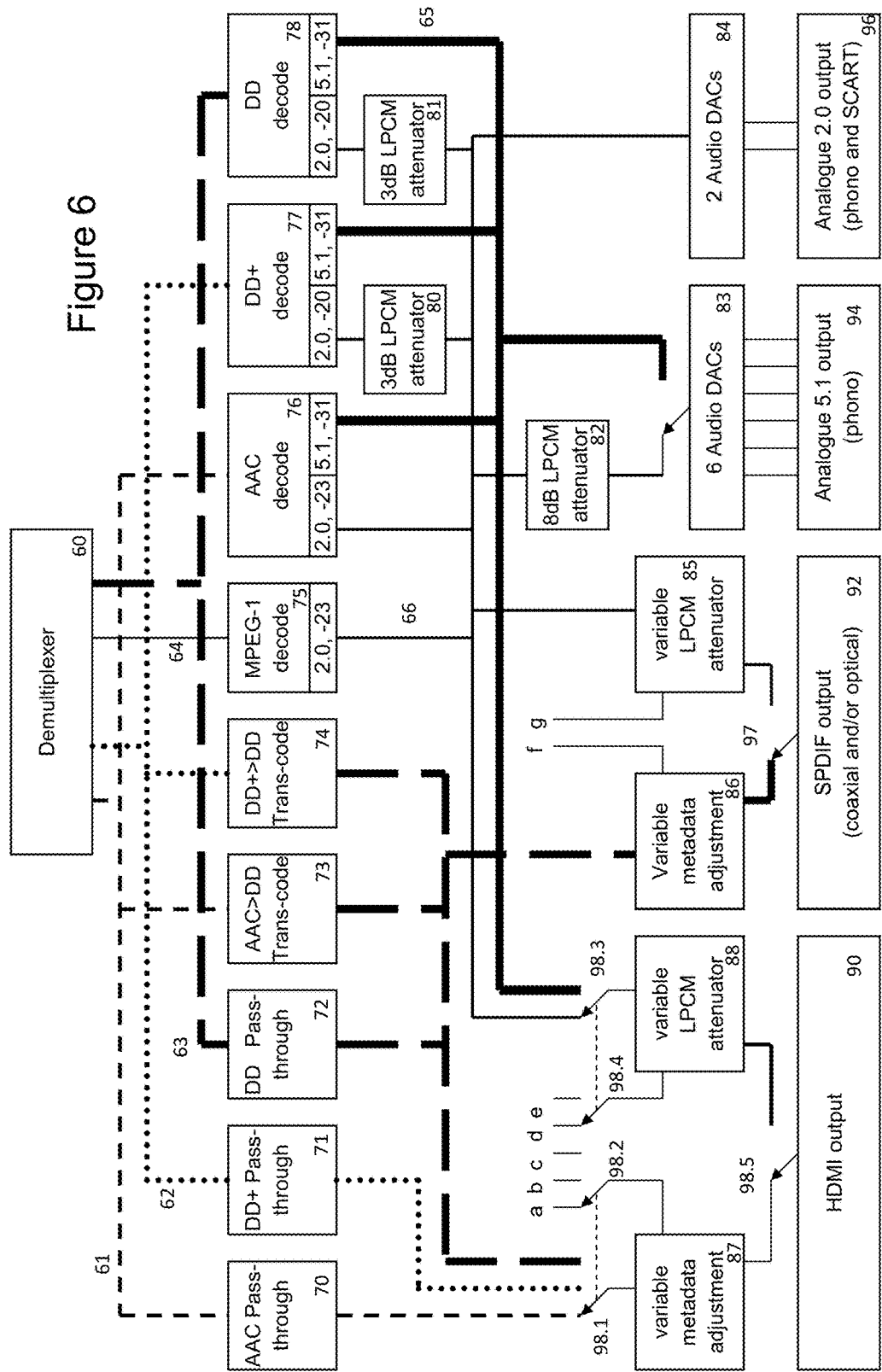
FIG. 6 is a schematic illustration of the audio functionality within an STB or other audio receiver device, according to an example of the invention.

FIG. 6 shows the audio functionality within the STB according to the present example. The output of the wizard described above in connection with FIGS. 3 to 5 sets the value of variables a, b, c, d, e, f, and g which are the values fed to the variable attenuators and metadata adjusters, used to match the loudness of the audio signals of various formats before output from the STB. This process is discussed below.

The functional elements in the logical diagram in FIG. 6 correspond to real hardware system components, and may be implemented in the STB as separate components as shown. However, an efficient or economic implementation may combine several functional components into a single physical element. For example, a system-on-a-chip silicon implementation may include DolbyDigital™ (DD) and DolbyDigital+™ (DD+) decoding within a single element; further the 3 dB PCM attenuators immediately below these elements may also be combined within that decoder.

Also, where separate lines, paths, or switches are shown, it will be appreciated that the data can be multiplexed onto a single common internal bus, and where only one type or source of data is active on a given path at a time, then a single data path will be used to practically mediate several of the paths that are shown in FIG. 6. Wherever multiple attenuators are arranged in series, they can be combined into a single attenuator with the same overall effect. Finally it will be appreciated that not all STBs will include all of the functionality shown; for example, a STB might not include an analogue 5.1 output. If this is the case, then all of the elements that are only used to feed that output (6 audio DACs, 8 dB PCM attenuator) can be removed.

FIG. 6 shows the flow of the audio information beginning at the top of FIG. 6 where it is demultiplexed from the transport stream, which may contain one or more video and audio streams, associated data etc, by demultiplexer 60, to the bottom of FIG. 6 where the audio signal is output from the STB via one or more suitable connectors 90, 92, 94 and 96. Video processing is not shown, but is assumed to take place in parallel for any AV content. The functionality illustrated in FIG. 6, expresses in more detail the functionality contained within the audio decoder 27a and/or CPU of FIG. 2.

At the output of the demultiplexer, the different audio formats are output on separate lines; different audio formats will be flagged as such in the transport stream and carried on different packet identifiers (PIDs), so the separation may be implanted as a standard function of a demultiplexer, and once the appropriate PIDs have been identified from known DVB-SI tables (that is, tables in a format defined by the DVB standard which include entries labelling different audio formats in a known standardised format), this function is handed to a dedicated PID filter.

In FIG. 6, the different audio format paths are indicated by different lines types: the HE-AAC path is shown as a simple dashed line 61; the DD+ path is shown dotted line 62; the DD path is shown as a thick dashed line 63; the MPEG-1 layer II path is shown as a thin line 64; the multichannel 5.1 PCM path is shown as a thick solid line 65; stereo PCM and other signals are shown by regular lines 66. All possible paths are shown, but at a given moment, only the chosen audio stream will be passed to the appropriate audio decoder, transcoder, or passed through, and the other paths will not be used, or in practice will not exist due to the dynamic nature of the internal multiplexed bus structure on such devices.

FIG. 6 shows a number of decoders, transcoders and pass through blocks including: AAC pass-through block 70, DD+ pass-through block 71, DD pass-through block 72, AAC to DD Transcoder 73, DD+ to DD transcoder 74, MPEG-1 decoder 75, AAC decoder 76, DD+ decoder 77, and DD decoder 78. The Dolby formats DD (Dolby Digital=AC-3) and DD+ (Enhanced Dolby Digital=E-AC-3) and HE-AAC (sometimes marketed as Dolby Pulse) can sometimes carry stereo (2.0) signals, and sometimes carry "multichannel" (used in this context to mean more than two channels, rather than simple more than one) signals (3.0, 4.0, 5.0, 5.1 etc). Mono source signals are usually carried as two identical "stereo" channels, so are still treated as 2.0. The multichannel signals can be decoded to the original number of channels, or downmixed to stereo (2.0) within the decoder. Stereo signals can be decoded to the original number of channels, or upmixed to 5.1 within the decoder, either by sending the original 2.0 feeds to the front left and right speaker feeds and leaving the other channels silent, or by using some more sophisticated upmixing algorithm that spreads the signal between more than two of the 5.1 outputs.

The Dolby decoder(s) will normally set a target level of −31 dB for multichannel outputs, and −20 dB for stereo outputs. In the present example, other stereo formats (MPEG-1 layer II, HE-AAC stereo) have a target level of −23 dB. Hence fixed 3 dB attenuators 80 and 81 are added to the stereo output(s) of the Dolby decoder(s) 77 and 78 to match the level of the other stereo audio sources. Alternatively, where possible, the Dolby decoders may be adjusted to set a target level of −23 dB, and those particular attenuators would no longer be necessary. An 8 dB attenuator 82 is added to the feed from the stereo formats to the 5.1 outputs 94, to match the stereo signals at −23 dB to the 5.1 signals at −31 dB. In this context those two stereo channels are typically fed to the front left and front right speaker feeds of the 5.1 output.

Hence, under the decoders 75, 76, 77 and 78, the nomenclature 2.0, −23 means a stereo (2.0) output at a target level of −23 dB, and 5.1, −31 means a multichannel (up to 5.1) output at a target level of −31 dB.

When outputting digital signals, all downstream devices can "decode" (essentially, receive and digital-to-analogue convert) stereo LPCM, many will be able to decode DD, but few will be able to decode DD+, HE-AAC, and 5.1 LPCM. This is true even of most legacy devices which can handle 5.1 channels. Hence to facilitate the transport of all 5.1 source signals to all 5.1 capable devices in 5.1 format, transcoders 73 and 74 from HE-AAC and DD+ to DD are included. These transcoders convert the audio from one coding format to another, but attempt to preserve the loudness and loudness metadata during the conversion.

The "pass through" elements 70, 71 and 72 are essentially "no operation" elements (they do nothing), and are shown to clarify that no change is made to the signal at that point (compared with the alternative paths on the same line of FIG. 6 which do include real functionality).

In the bottom-right corner of FIG. 6, digital-to-analogue convertors 83 and 84, which convert the LPCM digital signals to analogue signals, are shown above the analogue outputs 94 and 96. A volume control device, either in the form of another variable PCM attenuator before the DACs, or an analogue device within or after the DACs, may be included but is not shown here.

The analogue outputs 94 and 96 are a useful example of current state-of-the-art loudness matching in a scenario where no unpredictable downstream devices are involved. The loudness of the different signal sources via the same analogue output 94 and 96 is matched within the STB by careful design and consideration, i.e. controlling the target volumes of the various decoders, knowing the broadcast level of MPEG-1 audio (which does not respond to a target level or have any built-in concept of a loudness reference level), and including the appropriate attenuators in-line to match these disparate levels.

In contrast, the bottom left corner and bottom middle of FIG. 6 illustrates digital outputs (HDMI output 90, and SPDIF output 92 for example) where down-stream devices may upset the loudness of different formats. The functionality provided by the example of the invention described above provides a suitable mechanism for addressing this.

Considering the SPDIF output 92 first, LPCM 2.0 or a DD bitstream (typically 5.1) may be output. The switch 97 above the SPDIF output is designed to automatically select the DD path (illustrated by the thick dashed line) when multichannel audio is available, and to select the stereo path (illustrated by the normal line) when only stereo audio is available. (It is possible that when the stereo content originates in DD format, the DD path will be selected for such content to allow dynamic range metadata to be sent downstream. The DD path will not usually be used for stereo content originating in other formats, because though it is possible to transcode HE-AAC and even MPEG-1 layer II to DD, this would unnecessarily degrade the audio quality.)

The LPCM audio passes through the MPEG decoder 75 to a variable attenuator 85, set to attenuate the audio by the value "g", which is the output of the wizard for LPCM (decoded MPEG-1 layer II) audio when (in this example) tested via equipment connected to the SPDIF output. The variable LPCM attenuator 85 takes the attenuation value "g" in dB, converts it into an equivalent scaling factor using the formula scale_factor=$10^{\wedge}(g/20)$, and multiplies each audio sample by this scale_factor. The resulting audio samples may be dithered, rounded, truncated etc. In practice, the conversion from dB to scale factor may occur elsewhere (the memory structure illustrated in FIG. 5 may even store scale factors rather than dB values), and the LPCM attenuator may be integrated within some other part of the audio pipeline, but the overall effect will be as described above.

The DD audio passes through a variable metadata adjustment block 86, set to adjust the loudness metadata (i.e. in this case, dialnorm) to attenuate the audio by the value "f", which is the output of the equalisation process for DD audio when tested via the equipment connected to the SPDIF output. The variable metadata adjustment block 86 parses the coded audio bitstream to find all instances of the appropriate metadata element(s) (in this case, dialnorm), and adjusts them by the amount "f".

As described elsewhere, the final stage of the wizard may already have "processed" these values to minimise the absolute value of "f", changing the value of "g" to compensate as long as this does not lead to excessive amplification and hence clipping.

Hence the level of MPEG-1 layer II decoded to LPCM, and any source audio format output as DD, are matched.

For completeness, it should be noted that some users will use the SPDIF output 92 to feed devices, such as stand-alone audio DACs, that only handle LPCM. These uses will set a menu option which locks the switch above the SPDIF output to LPCM. In this scenario, the functionality of the example described above need not operate, since the loudness matching is not interfered with by the downstream equipment and is correctly delivered by the elements described above with respect to the analogue outputs.

The HDMI output 90 acts in a similar way, but with additional functionality which adds complexity to the discussion. The HDMI specification includes various methods whereby a source device (in this instance, the STB shown in FIG. 6) can query the sink device (in the case, a TV or home cinema amplifier etc) to determine which formats the sink device can decode. Hence the sink device may support DD+, and may support 5.1 LPCM, and may even support HE-AAC decoding. For each format the sink device claims to support, the decision must be made whether to "pass-through" that bitstream to the sink device for decoding, or to decode it with within the STB. Typically, if the sink device claims to decode a given format, it is passed through. Some STBs offer a manual over-ride to this, forcing the decoding to be carried out with the STB. This is provided for the situation where the sink device is in error, or does not handle a particular source as the user wishes. In the present case, an output from the wizard revealing that a particular format is decoded to the wrong loudness by the sink device, is one good reason to decode that format within the STB. Hence, while in general, the five switches 98 above the HDMI output (one immediately above it, and two dual-switches further up) are set to pass-through any format that the HDMI sink device can decode, there are exceptions.

Where the sink device does not (or, after assessing the loudness matching as above, "should not") accept the pass through audio, if the source is multichannel then the alternatives in order of preference are LPCM 5.1, transcode to DD, or LPCM 2.0. If the source is stereo then LPCM 2.0 will always be acceptable (support is mandatory in the HDMI specification). Hence the five switches 98 are set based on the input audio format, the capabilities of the sink, and the need to implement loudness matching.

A pair of dual/parallel switches 98.1 to 98.5 ensure that the correct attenuation value (a,b,c,d, and e in FIG. 6) is selected alongside the associated audio format. So, for example, if an HE-AAC stream is passed through by one switch 98.1, value "a" is sent to the variable metadata adjustment function 87 by the corresponding dual/parallel switch 98.2; value "a" being the attenuation value generated by the wizard for listening to HE-AAC encoded audio via the equipment attached to the HDMI output 90. Similarly, if for example a 5.1 LPCM stream is chosen by one switch 98.3, value "e" is sent to the variable LPCM attenuator 88 by another dual/parallel switch 98.4; value "e" being the attenuation value generated by the wizard for listening to 5.1 LPCM via the equipment attached to the HDMI output. Switch 98.5 automatically selects between the outputs of the variable metadata adjustment block 87 and variable LPCM attenuator 88 to supply a signal to the HDMI output 90 as appropriate. In this way, the appropriate attenuation or metadata adjustment is always used with each format.

It will be appreciated that there are different circuit designs or processing topologies that can accomplish exactly the same function, so long as the correct attenuation or scaling values are available from the wizard. It will also be appreciated that combinations that will never be used (for example, the sink may not support HE-AAC) do not need to be worked through (i.e. there is no need to attempt to establish value "a" via the wizard since it cannot be used).

Where the wizard process identifies issues in downstream equipment requiring a different level of attenuation for Dolby Digital stereo (2.0) content than for Dolby Digital multichannel (e.g. 5.1) content, then to facilitate this, one of two measures will be used. Either the 5.1 content will be sent-out in pass-through mode (with the required change, if any, to the dialnorm data), and the 2.0 content will be decoded to PCM before being sent out (with the required attenuation to the LPCM data), or alternatively an additional element will be added (not shown on FIG. 6) to differentiate between 2.0 and 5.1 bitstreams, and to adjust the dialnorm data by a different amount for each, as appropriate (i.e. as revealed by the wizard).

It is quite likely that a user will only use one of SPDIF and HDMI at a given time, and may only use one ever, so it may not be necessary to match anything between the two different outputs, and it may only be necessary to run the wizard for one of them. Hence FIG. 6 shows the sum total of almost all processing that could be required, but a real implementation may only offer a subset, and a working version in a user's home may only actively use a small part.

It is worth emphasising that, apart from the wizard, all of the processing described above is automatic and transparent to the user, and will simply operate without further intervention from them.

It is stressed that the above scenarios are described for completeness, and to ensure that all possible audio formats and potential audio problems can be satisfactorily dealt with by the comparison process. For the majority of users, one or two comparisons will be all that is needed to check and equalise the audio levels if correction is required. The comparison process itself will likely take no more than a few seconds for a user to complete, and will not need to be repeated until the user replaces their STB, amplifier or TV.

Although the wizard has been described as presenting pairs of audio clips for comparison, it will be appreciated that more than two audio clips could be played in succession. In this case, the user could be asked to answer different questions, such as to grade them in order of loudness, or indicate a loudness score for each. From this input, the software could apply suitable gain adjustments to the signal and replay for confirmation. Alternatively, the user could be presented with a volume slider that they are required to adjust for each codec so that the levels can be set for each codec accordingly. The user interface and equalisation wizard described above is preferred as it is the most simple to understand, and benefits from allowing even the most unskilled user to optimise the output.

A particular advantage provided by the embodiments described above is that the user does not need to have any specialist technical knowledge of their audio equipment to be able to optimise their audio output. Furthermore, as the optimisation process is based on the user's perception of the audio, not on the type of audio equipment being used, the optimisation process can be effective regardless of the type of equipment attached to the output. All that is necessary to keep the optimisation process effective is to keep the optimisation software updated with options to equalise the output audio based on the codecs that are used in the industry at the time.

Additionally, by taking the user through the audio set up process, the user will know that the STB is operating properly, and that any remaining audio level discrepancies are features of the broadcasts themselves.

Although, the above example has been made with reference to an STB, it will be appreciated that the processing may be carried out in a DVD or Blu-Ray™ player, of games console or computer. This is especially true for non-broadcast sources that are to be equalised.

Further, in the example embodiments discussed above, the user is required to indicate via the graphical user interface of FIG. 3, whether or not the two audio signals are perceived to have the same loudness. It is possible in an alternative embodiment of the invention that this process is automated. In this embodiment, therefore, the integrated decoder device, such as that shown in FIG. 2, is provided with a microphone or other input for detecting and capturing the audio signals played back via the audio reproduction device. In step 3 of FIG. 4, instead of asking a user to perform the detection and make an indication on screen of which of the signals A or B is loudest, the detection and comparison is performed by software running in the STB. Once each of the audio signals is captured by the microphone, the STB operates to determine the loudness of each signal. This can be performed using any suitable algorithms for determining the loudness of an audio signal, such as the EBU R128 and Dolby LEQ algorithms mentioned above, or simple filtered and/or gated RMS measures, as will be known to those skilled in the art. If the loudness of the audio signals detected at the microphone are determined to be different, then the software can reduce the output loudness of the louder signal by a predetermined number of decibels, say −6 dB or even a smaller number, and repeat the process, outputting the two audio signals, capturing recordings at the microphone, and performing the adjustment process. If the loudness determination via microphone is trusted, then no iterations are required and the initial reading can be used directly to set the desired gain. However, given the possibility that something may interfere with the process (for example, someone coughing during the process and hence confusing the loudness estimation), it is preferable to run at least one iteration after the gain has been changed.

The description of the above examples embodiments has been made for the purposes of illustration only. The skilled person will readily appreciate that modifications to these without departing from the teaching of the application. Furthermore, although separate embodiments have been described, the skilled person will appreciate that the features of different embodiments can be used with one another in variations of the above embodiments. Nothing is intended to limit the scope of the invention as defined by the following claims.

The invention claimed is:

1. A method to control an audio receiver device to equalize loudness levels of audio signals output for playback on an audio playback device, the method comprising:
   outputting at least a first output audio signal and a second output audio signal to an audio output for playback on the audio playback device, the first output audio signal and the second output audio signal being digitally encoded in different audio formats, and the first output audio signal being reproduced at a first loudness level and the second audio signal being reproduced at a second loudness level by the audio playback device;
   controlling a connected display to invite user input from a user indicating a relative loudness of the first output audio signal compared to the second output audio signal;
   receiving a plurality of user input associated with the connected display, wherein each of the plurality of user input indicates the relative loudness when each of the plurality of user input are received;
   based on each of the received plurality of user input, adjusting at least one of the first loudness level and the second loudness level, wherein the adjusting continues until one of the received plurality of user input indicates that the first loudness level and the second loudness level are perceived to be heard at a same loudness level; and
   in response to receiving the user input that indicates the first loudness level and the second loudness level are perceived to be heard at the same loudness level, saving information corresponding to at least one of the first loudness level and the second loudness level in memory for future reproduction of the audio signals.

2. The method of claim 1, further comprising:
receiving a digital input audio signal, wherein the input digital audio signal is of a predefined format;
communicating the input digital audio signal to a first decoder that decodes the received input digital audio signal into the first output audio signal, wherein the first decoder uses a first codec to decode the input digital audio signal; and
communicating the input digital audio signal to a second decoder that decodes the received input digital audio signal into the second output audio signal, wherein the second decoder uses a second codec to decode the input digital audio signal, and wherein the second codec is different from the first codec.

3. The method of claim 2, for at least one of the first decoder and the second decoder, further comprising:
applying a first correction value to modify the input digital audio signal using the first codec, wherein the first correction value adjusts the received input digital audio signal during the decoding to the first loudness level; and
applying a second correction value to modify the input digital audio signal using the second codec,
wherein the second correction value adjusts the received input digital audio signal during the decoding to the second loudness level.

4. The method of claim 3, wherein applying the first correction value and the second correction value comprises:
applying, by the first codec, one of a first predefined positive gain and a first predefined negative gain to the received input digital audio signal; and
applying, by the second codec, one of a second predefined positive gain and a second predefined negative gain to the received input digital audio signal.

5. The method of claim 4, wherein adjusting at least one of the first loudness level and the second loudness level comprises:
adjusting, using the first codec, the first predefined negative gain when the first loudness level is greater than the second loudness level,
wherein the second decoder does not adjust one of the second predefined positive gain and the second predefined negative gain.

6. The method of claim 3, wherein applying at least one of the first correction value and the second correction value comprises:
applying, by the first codec, one of a first predefined positive gain and a first predefined negative gain to the received input digital audio signal during the decoding of the input digital audio signal; and
changing, by the second codec, a dialnorm value of metadata of the received input digital audio signal during the decoding of the input digital audio signal.

7. The method of claim 6, wherein adjusting at least one of the first loudness level and the second loudness level comprises:
adjusting, by the first codec, the first predefined negative gain when the first loudness level is greater than the second loudness level,
wherein the second decoder does not adjust the metadata.

8. The method of claim 6, wherein adjusting at least one of the first loudness level and the second loudness level comprises:
adjusting, by the second codec, the dialnorm value of the metadata of the received input digital audio signal when the second loudness level is greater than the first loudness level,
wherein the first decoder does not adjust one of the first predefined positive gain and the first predefined negative gain.

9. The method of claim 2, further comprising:
receiving the digital input audio signal in a transport stream that is multiplexed with a plurality of other digital input signals; and
demultiplexing, using a demultiplexer, the digital input audio signal from the plurality of other digital input signals.

10. The method of claim 9, wherein the demultiplexer, the first decoder and the second decoder reside in the audio receiver device that is communicatively coupled to the audio playback device.

11. The method of claim 9, wherein the audio playback device is a first audio playback device, wherein the demultiplexer and the first decoder reside in the first audio receiver device that is communicatively coupled to the audio playback device, and wherein the second decoder resides in a second audio receiver device that is communicatively coupled to the audio playback device, the method further comprising:
communicating the input digital audio signal that has been demultiplexed from the plurality of other digital input signals from the first audio receiver device to the second audio receiver device,
wherein the second decoder in the second audio playback device uses the second codec to decode the input digital audio signal.

12. The method of claim 2, further comprising:
receiving the digital input audio signal from a memory of the audio playback device that stores the input digital audio signal,
wherein the input digital audio signal is a predefined audio clip signal selected from a group consisting of:
a pink noise input digital audio signal;
a white noise input digital audio signal; and
a speech input digital audio signal.

13. The method of claim 2, further comprising:
communicating the input digital audio signal to a third decoder that decodes the received input digital audio signal into a third output audio signal, wherein the third decoder uses a third codec for the decoding of the input digital audio signal;
outputting the third output audio signal to the audio output for playback on the audio playback device, wherein the third output audio signal is digitally encoded in an audio format that is different from the audio formats of the first output audio signal and the second output audio signal, and wherein the third output audio signal being reproduced at a third loudness level is different from the first loudness level;
controlling the connected display to invite further input from the user indicating a relative loudness of the third output audio signal compared to the first output audio signal;
receiving a further user input associated with the connected display;
based on the further user input, adjusting at least one of the first loudness level and the third loudness level, wherein the adjusting continues until the user indicates that the first loudness level and the third loudness level are perceived to be heard at the same loudness level; and in response to receiving the user indication that indicates the first loudness level and the third loudness level are perceived to be heard at the same loudness level, saving information corresponding to at least one of the first loudness level and the third loudness level in memory for future reproduction of the audio signals.

14. The method of claim 1, wherein the first output audio signal and the second output audio signal that are digitally encoded in different audio formats comprise at least one selected from a group consisting of Moving Picture Experts Group (MPEG) 1 Layer II, MPEG 1 Layer III, MPEG 2 Layer III, High-Efficiency Advanced Audio Coding (HE-AAC) version 1, HE ACC version 2, Advanced Audio Coding (AAC), Low Complexity-Advanced Audio Coding (LC-AAC), Dedicated to Sound (DTS), Dedicated to Sound Extended Surround (DTS-ES), Dolby Digital, Dolby Pulse, Dolby Digital Plus, Near Instantaneous Companded Audio Multiplex (NICAM), Opus, Ogg Vorbis, Linear Pulse Code Modulated (LPCM), and an analogue signal converted to linear pulse code modulation (LPCM).

15. An audio receiver device, comprising:
at least one of a tuner and a demodulator operable to receive a digital input audio signal in a transport stream that is multiplexed with a plurality of other digital input signals;
a demultiplexer operable to demultiplex the digital input audio signal from the plurality of other digital input signals;
an audio output that connects the audio receiver device to at least one connected audio playback device;
a memory operable to:
store control software operable to equalize loudness levels of a plurality of output audio signals that are output for playback on the at least one connected audio playback device; and
store a plurality of correction values that are operable to adjust the received input digital audio signal during a decoding of the input digital audio signal to a corresponding one of the plurality of output audio signals; and
a processor operable to:
output at least a first output audio signal,
wherein the first output audio signal is decoded using a first correction value associated with a first codec that is used to decode the received digital input audio signal, and
wherein the first output audio signal is output to the audio output for playback at a first loudness level on the at least one connected audio playback device;
end output of the first output audio signal;
output a second output audio signal in response to ending output of the first output audio signal,
wherein the second output audio signal is decoded using a second correction value associated with a second codec that is used to decode the received digital input audio signal,
wherein the second output audio signal is output to the audio output for playback at a second loudness level on the at least one connected audio playback device, and
wherein the first audio signal and the second signal are digitally encoded in different audio formats;

control a connected display to present a graphical user interface to invite a plurality of user input from a user indicating a relative loudness of the first audio signal compared to the second audio signal,
wherein the graphical user interface permits the user to indicate one of the first loudness level of the first audio signal and the second loudness level of the second audio signal as being the loudest of the output first loudness level and the subsequently output second loudness level;
based on each one of the plurality of user input from the user, adjust at least one of the first loudness level of the first audio signal and the second loudness level of the second audio signal;
repeat the outputting of the first output audio signal, ending output of the first output audio signal, outputting the second output audio signal, inviting the user to indicate one of the first loudness level of the first audio signal and the second loudness level of the second audio signal as being the loudest, and adjusting at least one of the first loudness level of the first audio signal and the second loudness level of the second audio signal until one of the plurality of user input indicates that the first loudness level and the second loudness level are perceived to be heard at the same loudness level; and
save information corresponding to the user input that indicates that the first loudness level and the second loudness level are perceived to be heard at the same loudness level, wherein the information is saved in the memory for future reproduction of the audio signals.

16. The audio receiver device of claim 15, wherein the saved information corresponding to the user input that indicates that the first loudness level and the second loudness level are perceived to be heard at the same loudness level adjusts the first correction value associated with the first codec if the first loudness level was greater that the second loudness level, and wherein the saved information corresponding to the user input that indicates that the first loudness level and the second loudness level are perceived to be heard at the same loudness level adjusts the second correction value associated with the second codec if the second loudness level was greater that the first loudness level.

17. The audio receiver device of claim 15, for at least one of a first decoder and a second decoder, the processor is further operable to:
apply a first correction value to modify the input digital audio signal using the first codec used by the first decoder, wherein the first correction value adjusts the received input digital audio signal during the decoding to the first loudness level; and
apply a second correction value to modify the input digital audio signal using the second codec used by the second decoder, wherein the second correction value adjusts the received input digital audio signal during the decoding to the second loudness level,
wherein the second correction value is different from the first correction value.

18. The audio receiver device of claim 17, wherein the processor, when repeating the output of the first output audio signal, ending output of the first output audio signal, outputting the second output audio signal, inviting the plurality of user input to indicate one of the first loudness level of the first audio signal and the second loudness level of the second audio signal as being the loudest, and adjusting at least one of the first loudness level of the first audio signal and the second loudness level of the second audio signal, the processor is further operable to:

adjust, using the first codec, a first predefined positive gain when the second loudness level is greater than the first loudness level; and adjust, using the first codec, a first predefined negative gain when the first loudness level is greater than the second loudness level, wherein the second decoder does not further adjust the input digital audio signal.

19. The audio receiver device of claim 15, wherein during the applying of at least one of the first correction value and the second correction value, the processor is further operable to:

apply, using the first codec, one of a first predefined positive gain and a first predefined negative gain to the received input digital audio signal during the decoding of the input digital audio signal; and changing, using the second codec, a dialnorm value of metadata of the received input digital audio signal during the decoding of the input digital audio signal.

20. The audio receiver device of claim 19, wherein the processor, when repeating the output of the first output audio signal, ending output of the first output audio signal, outputting the second output audio signal, inviting the plurality of user input to indicate one of the first loudness level of the first audio signal and the second loudness level of the second audio signal as being the loudest, and adjusting at least one of the first loudness level of the first audio signal and the second loudness level of the second audio signal, the processor is further operable to:

adjust, using the second codec, the dialnorm value of the metadata of the received input digital audio signal when the second loudness level is greater than the first loudness level, wherein the first decoder does not further adjust the input digital audio signal.

\* \* \* \* \*